US011107807B1

(12) United States Patent
Liu et al.

(10) Patent No.: US 11,107,807 B1
(45) Date of Patent: Aug. 31, 2021

(54) IC PACKAGE HAVING A METAL DIE FOR ESP PROTECTION

(71) Applicant: Nanya Technology Corporation, New Taipei (TW)

(72) Inventors: Fang Wen Liu, New Taipei (TW); Tseng-Fu Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 71 days.

(21) Appl. No.: 16/789,754

(22) Filed: Feb. 13, 2020

(51) Int. Cl.
*H01L 27/02* (2006.01)
*H01L 23/00* (2006.01)

(52) U.S. Cl.
CPC .......... *H01L 27/0296* (2013.01); *H01L 24/49* (2013.01); *H01L 2924/14* (2013.01); *H01L 2924/1811* (2013.01)

(58) Field of Classification Search
CPC .. H01L 27/0296; H01L 24/49; H01L 2924/14
See application file for complete search history.

(56) References Cited

U.S. PATENT DOCUMENTS

| 5,166,772 | A | 11/1992 | Soldner et al. |
| 9,853,446 | B2 | 12/2017 | Gu et al. |
| 2017/0033062 | A1* | 2/2017 | Liu ........................ H01L 21/486 |
| 2019/0311960 | A1* | 10/2019 | Tan ......................... H01L 22/34 |

* cited by examiner

*Primary Examiner* — Errol V Fernandes
(74) *Attorney, Agent, or Firm* — Birch, Stewart, Kolasch & Birch LLP

(57) ABSTRACT

An IC package having a metal die for ESD protection includes: a printed circuit board having power connections and ground connections; a function die; and a metal die adhered unto the function die and electrically insulated from the function die, wherein the metal die comprises a metal layer and a dummy die underlying the metal layer, and the metal layer is electrically coupled to one or more of the power connections and ground connections of the printed circuit board to provide package level electrostatic discharge (ESD) protection; and an encapsulant covering the metal die, the function die and a surface of the printed circuit board supporting the metal die and function die.

14 Claims, 3 Drawing Sheets

IC PACKAGE HAVING A METAL DIE FOR ESP PROTECTION

BACKGROUND OF THE INVENTION

Field of the Invention

The present invention relates to an integrated circuit (IC) package and a fabrication method thereof, and more particularly to an integrated circuit (IC) package having package level electrostatic discharge (ESD) protection and a fabrication method thereof.

Description of the Prior Art

The scaling of deep sub-micron CMOS and high speed technologies has created greater electrostatic discharge (ESD) protection design challenges. Among these hurdles, the ESD circuit designs of input/output (I/O) pins have been found to be complicated due to speed concern. The current peak is about 1.3 A for 2000V human-body-model (HBM) ESD stress but the charged-device-model (CDM) 500V peak can be up to 10 A. The CDM ESD event typically has a fast rise time of only ~0.2 ns. Such very fast transient ESD pulse makes the CDM ESD events play major roles to cause failures in advanced manufacturing and packaging environments. It has shown that the CDM ESD protection has been a serious concern in the deep sub-micron CMOS IC with much thinner gate oxide. Increasing ESD device to improve ESD performance in I/O pins would also increasing I/O's capacitance. That method doesn't meet high speed requirement. In ESD testing, the IC package is tested by an ESD tester to determine whether the IC package is within specified electronic stress boundaries. If ESD failure happened, the process of re-designing of the die can be quite expensive.

U.S. Pat. No. 9,853,446 B2 discloses a first electrostatic discharge (ESD) protection component is embedded in an IC package substrate. The first ESD protection component is configured as a semiconductor device. The first ESD protection component is coupled to I/O pads of a die. The first ESD protection component provides better ESD protection than an internal ESD protection component inside the die because the first ESD protection component is much larger than the internal ESD protection component. The first ESD protection component can be designed separately from the die based on an expected and/or anticipated application. However, the first ESD protection component that is a semiconductor device will increase loading of I/O pads of the die and increase cost much.

Therefore, there is a need for an IC package that can meet the demands of the devices in which the IC package is implemented in, the reliability requirements and electronic stress boundaries without having to redesign the die of the IC package and it also cost effective.

SUMMARY OF THE INVENTION

The present invention provides an IC package having a metal die for ESD protection and a fabricating method thereof. Embodiments of the invention include a semiconductor package that includes a metal die attached to a function die and being electrically insulated with the function die. The metal die is electrically coupled to one or more of power connections and ground connections of a printed circuit board on which the function die is mounted and providing ESD discharge paths with a lower resistance than the function die's power bus provides. The metal die is configured to provide package level ESD protection for the IC package and can conduct away electrostatic charges directly to the power connections and the ground connections of the printed circuit board to improve CDM performance. The metal die is configured with a metal layer and a dummy die underlying the metal layer as a separate component instead of being integrated in the function die and doesn't increase additional loading on I/O pins of the function die. When the function die's ESD performance is not good enough, it does not need to be re-designed. Instead, adding the metal die to the IC package can be effectively improving ESD performance.

According to an embodiment of the present invention, an IC package having a metal die for ESD protection includes a printed circuit board having a plurality of power connections and ground connections; a function die having a first surface and a second surface opposite to the first surface and a plurality of conductive pads on the first surface; wherein the second surface of the function die is in contact with an upper surface of the printed circuit board, one or more of the conductive pads is electrically coupled to one or more of the power connections and ground connections of the printed circuit board; a metal die over the first surface of the function die and electrically insulated from the function die, wherein the metal die comprises a metal layer and a dummy die underlying the metal layer, the dummy die is in contact with the first surface of the function die, and the metal layer is electrically coupled to one or more of the power connections and ground connections of the printed circuit board to provide package level electrostatic discharge (ESD) protection; and an encapsulant covering the metal die, the function die and the upper surface of the printed circuit board.

In an implementation of the present invention, the metal die is adhered unto the function die with adhesive.

In an implementation of the present invention, the metal layer covers a surface of the dummy die adjacent thereto and an area of the dummy die occupying the first surface of the function die is smaller than or equal to an area of the first surface of the function die.

In an implementation of the present invention, the function die includes a semiconductor substrate having an IC structure.

In an implementation of the present invention, a material of the dummy die is the same with that of the semiconductor substrate of the function die.

In an implementation of the present invention, the metal layer is deposited onto the dummy die by sputtering.

In an implementation of the present invention, the metal layer is a comprehensive metal layer or a patterned layer.

In an implementation of the present invention, a material of the metal layer is selected from one of Cu, Al, W etc.

In an implementation of the present invention, the metal die is electrically coupled to the one or more of the power connections and ground connections of the printed circuit board by wire bonding.

In an implementation of the present invention, the one or more of the conductive pads of the function die is electrically coupled to the one or more of the power connections and ground connections of the printed circuit board by wire bonding.

According to an embodiment of the present invention, a method for manufacturing an IC package having a metal die for ESD protection includes: providing a dummy die; forming a metal layer on a surface of the dummy die to provide a metal die; mounting the metal die unto a function die with the metal layer being exposed and let the metal die being electrically in isolation with the function die; disposing the function die unto an upper surface of a printed circuit board and electrically connecting the metal layer to one or more of power connections and ground connections of the printed circuit board; and forming an encapsulant covering the metal die, the function die and the upper surface of the printed circuit board.

In an implementation of the present invention, the metal layer is deposited on the dummy die by sputtering.

Related aspects and advantages of the invention will become apparent and more readily appreciated from the following detailed description of the invention, taken in conjunction with the accompanying drawings.

DETAILED DESCRIPTION OF THE PREFERRED EMBODIMENTS

The present invention will now be described by way of preferred embodiments with references to the accompanying drawings. Like numerals refer to corresponding parts of various drawings. Please note well-known circuits, structures and techniques may not be shown in detail in order not to obscure the aspects of the disclosure. Various embodiments will be disclosed herein. However, it is to be understood that the disclosed embodiments are only used as an illustration that can be embodied in various forms. In addition, each of the examples given in connection with the various embodiments are intended to be illustrative but not limiting to. Further, the figures are not necessarily conform to the sizes and dimension ratios of actual structures, and some features are magnified to show details of particular components (and any dimensions, materials, and similar details shown in the figures are intended to be illustrative and not limiting to). Therefore, the particular structural and functional details are disclosed herein are not interpreted as limitations, but are used only to teach those skilled in the relevant field technicians to practice the basis of the disclosed embodiments.

Figure 1:
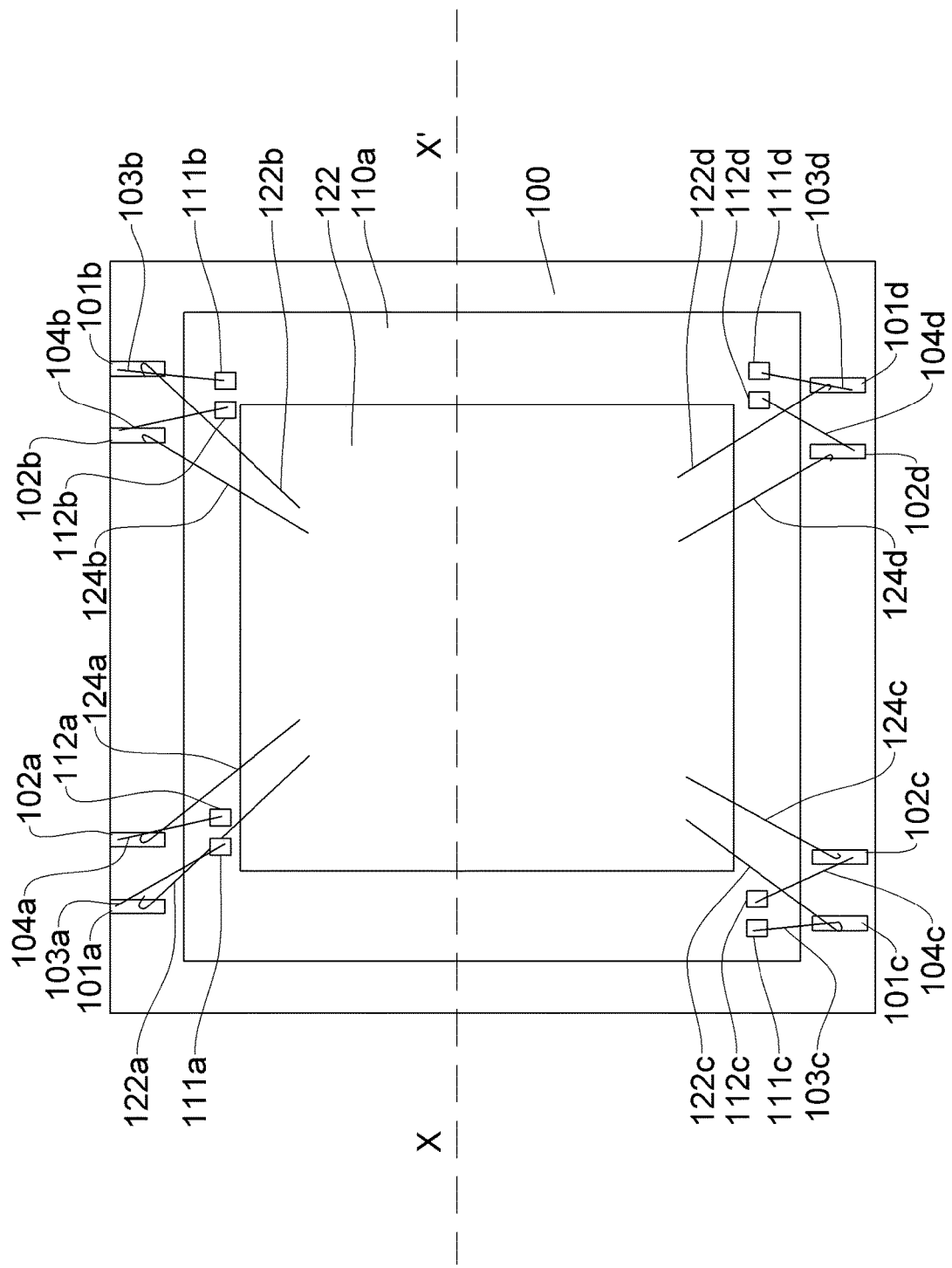
FIG. 1 is a schematic top view of an IC package having a metal die for ESD protection according to an embodiment of the present invention.
Figure 2:
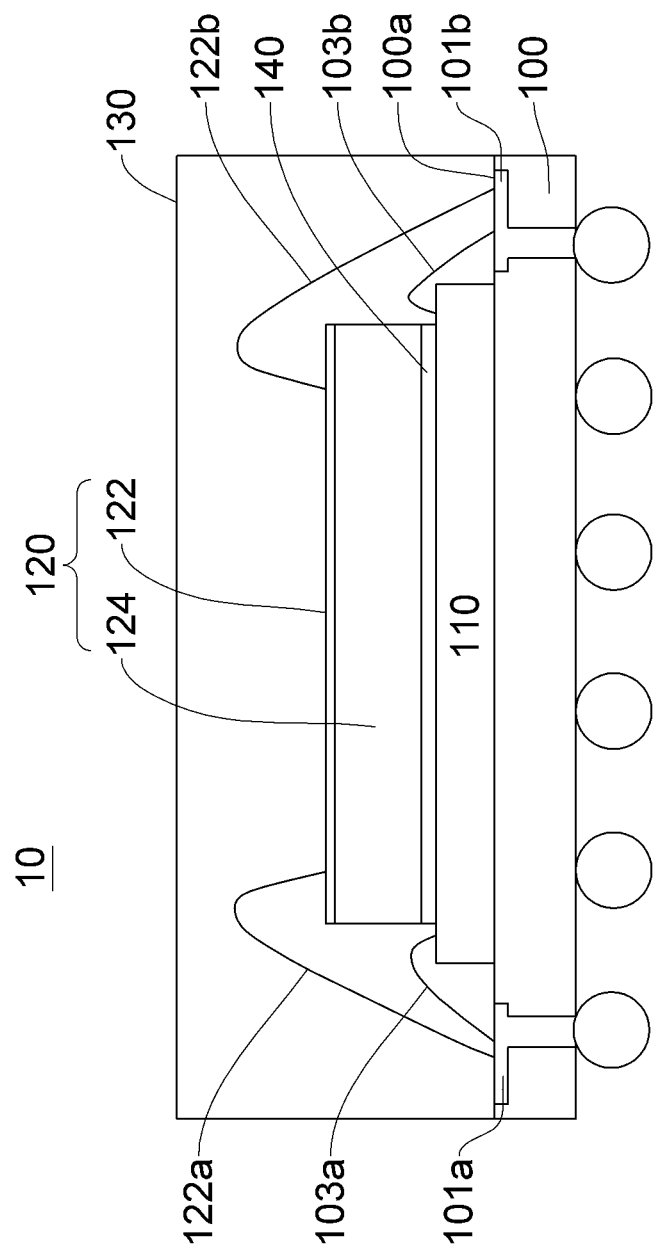
FIG. 2 is a schematic cross-sectional view of the IC package having a metal die for ESD protection of FIG. 1.

FIG. 1 is a schematic top view of an IC package having a metal die for ESD protection according to an embodiment of the present invention. FIG. 2 is a schematic cross-sectional view of the IC package having a metal die for ESD protection along the dotted line X-X' shown in FIG. 1. In the embodiment shown in FIG. 1 and FIG. 2, the IC package having a metal die for ESD protection 10 includes a printed circuit board 100, a function die 110, a metal die 120 and an encapsulant 130. A plurality of power connections 101a, 101b, 101c, 101d and a plurality of ground connections 102a, 102b, 102c, 102d are provided on an upper surface 100a of the printed circuit 100 and extending through the printed circuit board 100. The function die 110 has a first surface 110a and a second surface 110b opposite to the first surface 110b. The function die 110 is mounted on the printed circuit board 100 by way of the second surface 110b in contact with the upper surface 100a of the printed circuit board 100. A plurality of first conductive pads 111a, 111b, 111c, 111d and a plurality of second conductive pads 112a, 112b, 112c, 112d are provided on the first surface 110a of the function die 110. The first conductive pads 111a, 111b, 111c and 111d of the function die 110 are electrically coupled to the power connections 101a, 101b, 101c and 101d, for example by individual wire bonding 103a, 103b, 103c and 103d, to provide electrical paths for power sources from the printed circuit board 100 to the function die 110. The second conductive pads 112a, 112b, 112c and 112d of the function die 110 are electrically coupled to the ground connections 102a, 102b, 102c and 102d, for example by individual wire bonding 104a, 104b, 104c and 104d, to provide electrical paths for ground reference signals from the function die 110 to the printed circuit board 100. In some implementations, the function die 110 may be electrically coupled to the power connections 101a, 101b, 101c, 101d and the ground connections 102a, 102b, 102c, 102d in different means instead of wire bonding. In an implementation, the function die 110 includes a semiconductor substrate, for example a silicon substrate, having an IC structure.

The metal die 120 is disposed on the first surface 110a of the function die 110 and electrically insulated from the function die 110. In an implementation, the metal die 120 is adhered unto the function die 110 with adhesive 140. The metal die 120 includes a metal layer 122 and a dummy die 124 underlying the metal layer 122. The dummy die 124 is in contact with the first surface 110a of the function die 110. In an implementation, the dummy die 124 has the same semiconductor material as the semiconductor substrate of the function die 110. For example, the dummy die 124 may be a silicon substrate. The metal layer 122 is electrically coupled to the power connections 101a, 101b, 101c, 101d and the ground connections 102a, 102b, 102c, 102d of the printed circuit board 100 with individual wire bonding 122a, 122b, 122c, 122d, 124a, 124b, 124c and 124d. The metal die 120 is configured to provide package level electrostatic discharge (ESD) protection. The metal die 120 provides a lower resistance of ESD discharge path than the power bus of the function die 110. For example, the metal die 120 conducts away negative electrostatic charges to the power connections 101a, 101b, 101c, 101d of the printed circuit board 100, and the metal die 120 conducts away positive electrostatic charges to the ground connections 102a, 102b, 102c, 102d of the printed circuit board 100. The metal die 120 provides package level ESD protection to improve CDM performance of the IC package of the present invention.

In an implementation, the metal layer 122 covers a surface of the dummy die 124 adjacent thereto and an area of the dummy die 124 occupying the first surface 110a of the function die 110 is smaller than or equal to an area of the first surface 110a of the function die 110. In an implementation, the metal layer 122 is a comprehensive metal layer or a patterned metal layer. In an implementation, the material of the metal layer is one of Cu, Al, W etc. In an implementation, the metal layer 122 covers a surface of the dummy die 124 adjacent thereto and its sidewall surfaces, while the dummy die 124 is adhered to the function die 110 with nonconductive adhesive. The encapsulant 130 covers the metal die 120, the function die 110 and the upper surface 100a of the printed circuit board 100. The encapsulant 130 may be resin material, for example epoxy and the like.

Figure 3:
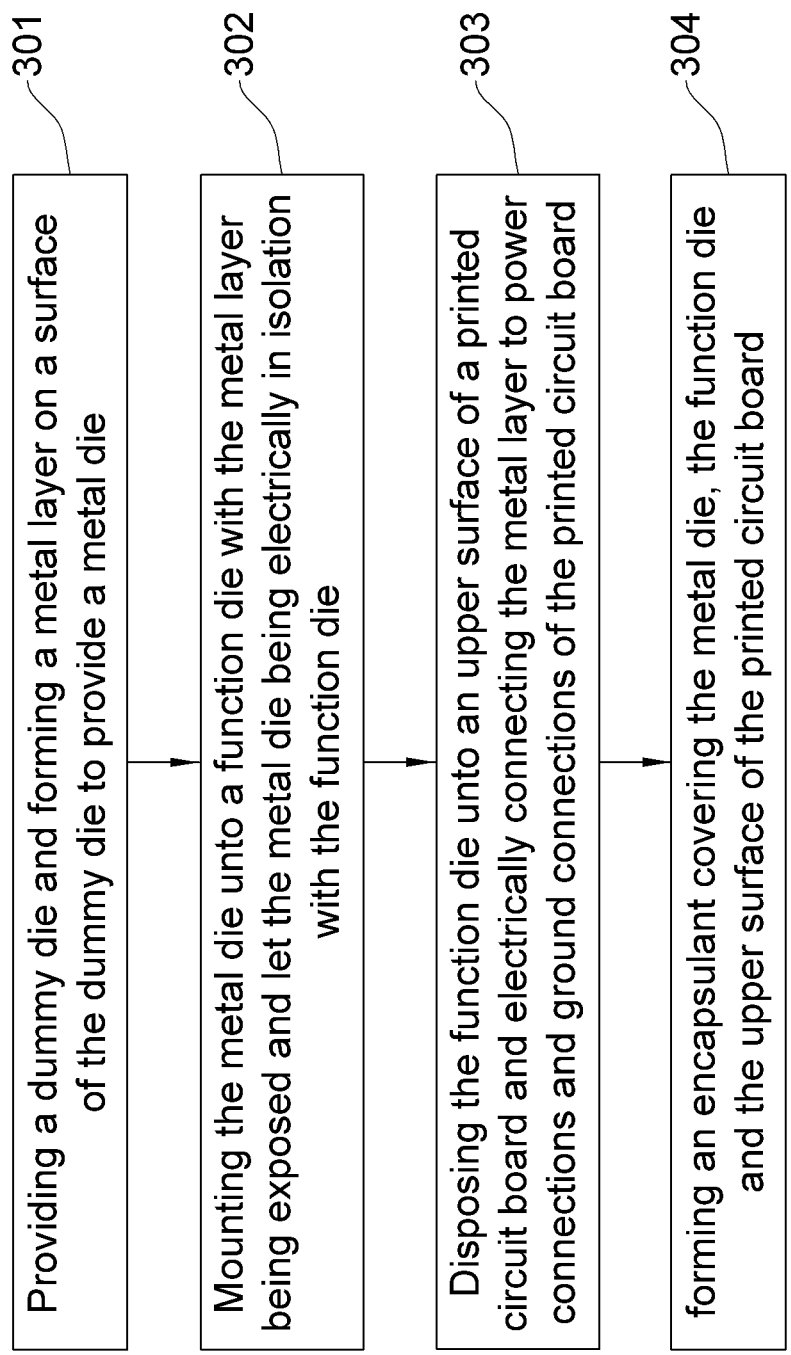
FIG. 3 illustrates a process flow for fabricating an IC package having a metal die for ESD protection according to the present invention.

FIG. 3 illustrates a process flow for fabricating an IC package having a metal die for ESD protection according to the present invention. The process flow shown in FIG. 3 may be used to fabricate the IC package having a metal die for ESD protection 10. For clarity, sequence steps of the process flow in FIG. 3 are described with reference to the IC package having a metal die for ESD protection 10 shown in FIG. 2. In step 301, a dummy die 124 is provided. The dummy die 124 may be a semiconductor substrate, for example a silicon substrate. A metal layer 122 is formed on a surface of the dummy die 124 to provide a metal die 120. In an implementation, the metal layer 122 is deposited on the dummy die 124 by sputtering. The material of the metal layer 122 may be any of Cu, Al and W etc. In step 302, mounting the metal die 120 unto a function die 110 with the metal layer 122 being exposed and let the metal die 120 being electrically in isolation with the function die 110. In an implementation, the metal die 120 is adhered to the function die 110 with adhesive 140. In step 303, the function die 110 is disposed unto an upper surface 100a of a printed circuit board 100 and electrically connecting the metal layer 124 to power connections 101a, 101b, 101c, 101d and ground connections 102a, 102b, 102c, 102d of the printed circuit board 100 with individual wire bonding. In step 304, filling resin material to form an encapsulant 130 to cover the metal die 120, the function die 110 and the upper surface 110a of the printed circuit board 100.

In some implementation, the order of the steps of the process flow may be changed or modified.

The above-mentioned embodiments of the present invention are exemplary and not intended to limit the scope of the present invention. Various variation or modifications made without departing from the spirit of the present invention and achieving equivalent effects shall fall within the scope of claims of the present invention.

What is claimed is:

1. An IC package having a metal die for ESD protection comprising:
    a printed circuit board having a plurality of power connections and ground connections;
    a function die having a first surface and a second surface opposite to the first surface and a plurality of conductive pads on the first surface; wherein the second surface of the function die is in contact with an upper surface of the printed circuit board, one or more of the conductive pads is electrically coupled to one or more of the power connections and ground connections of the printed circuit board;
    a metal die over the first surface of the function die and electrically insulated from the function die, wherein the metal die comprises a metal layer and a dummy die underlying the metal layer, the dummy die is in contact with the first surface of the function die, and the metal layer is electrically coupled to one or more of the power connections and ground connections of the printed circuit board to provide package level electrostatic discharge (ESD) protection; and
    an encapsulant covering the metal die, the function die and the upper surface of the printed circuit board.

2. The IC package having a metal die for ESD protection of claim 1, wherein the metal die is adhered unto the function die with adhesive.

3. The IC package having a metal die for ESD protection of claim 1, wherein the metal layer covers a surface of the dummy die adjacent thereto and an area of the dummy die occupying the first surface of the function die is smaller than or equal to an area of the first surface of the function die.

4. The IC package having a metal die for ESD protection of claim 1, wherein the function die comprising a semiconductor substrate having an IC structure.

5. The IC package having a metal die for ESD protection of claim 4, wherein a material of the dummy die is the same with that of the semiconductor substrate of the function die.

6. The IC package having a metal die for ESD protection of claim 1, wherein the metal layer is deposited onto the dummy die by sputtering.

7. The IC package having a metal die for ESD protection of claim 1, wherein the metal layer is a comprehensive metal layer or a patterned layer.

8. The IC package having a metal die for ESD protection of claim 1, wherein a material of the metal layer is selected from one of Cu, Al and W.

9. The IC package having a metal die for ESD protection of claim 1, wherein the metal die is electrically coupled to the one or more of the power connections and ground connections of the printed circuit board by wire bonding.

10. The IC package having a metal die for ESD protection of claim 1, wherein the one or more of the conductive pads of the function die is electrically coupled to the one or more of the power connections and ground connections of the printed circuit board by wire bonding.

11. A method for manufacturing an IC package having a metal die for ESD protection comprising:
    providing a dummy die;
    forming a metal layer on a surface of the dummy die to provide a metal die;
    mounting the metal die unto a function die with the metal layer being exposed and let the metal die being electrically in isolation with the function die;
    disposing the function die unto an upper surface of a printed circuit board and electrically connecting the metal layer to one or more of power connections and ground connections of the printed circuit board; and
    forming an encapsulant covering the metal die, the function die and the upper surface of the printed circuit board.

12. The method for manufacturing an IC package having a metal die for ESD protection of claim 11, wherein the function die comprises a semiconductor substrate having an IC structure.

13. The method for manufacturing an IC package having a metal die for ESD protection of claim 12, wherein a material of the dummy die is the same with that of the semiconductor substrate.

14. The method for manufacturing an IC package having a metal die for ESD protection of claim 11, wherein the metal layer is deposited on the dummy die by sputtering.

* * * * *